United States Patent [19]

Füldner

[11] Patent Number: 5,313,659
[45] Date of Patent: May 17, 1994

[54] METHOD OF AUTOMATICALLY TUNING A RADIO

[75] Inventor: Friedrich Füldner, Villingen, Fed. Rep. of Germany

[73] Assignee: Deutsche Thomson-Brandt GmbH, Villingen-Schwenningen, Fed. Rep. of Germany

[21] Appl. No.: 782,257

[22] Filed: Oct. 23, 1991

[30] Foreign Application Priority Data

Apr. 22, 1989 [DE] Fed. Rep. of Germany ....... 3913278
Apr. 14, 1990 [DE] Fed. Rep. of Germany ............ PCT/EP90/00590

[51] Int. Cl.⁵ ............................................. H04B 1/16
[52] U.S. Cl. ................................ 455/158.1; 455/186.1
[58] Field of Search ............... 455/160.1, 150.1, 158.1, 455/158.2, 158.4, 185.1, 186.1, 186.2, 179.1

[56] References Cited

U.S. PATENT DOCUMENTS 4,122,395 10/1978 Schotz .
4,466,127 8/1984 Ohgishi et al. .................. 455/186.1
5,023,938 6/1991 Takegawa et al. .............. 455/186.1

FOREIGN PATENT DOCUMENTS 3119122 12/1982 Fed. Rep. of Germany .

Primary Examiner—Reinhard J. Eisenzopf
Assistant Examiner—Chi Pham
Attorney, Agent, or Firm—Joseph S. Tripoli; Peter M. Emanuel; Frederick A. Wein

[57] ABSTRACT

A digital tuner for a radio in the medium frequency range includes a microprocessor and a keyboard. All frequencies are three digit numbers and are whole number multiples of nine. The desired three digit frequency is input to the microprocessor by manually entering the first two digits using the keyboard If, the third digit is ambiguous it must be inputted manually. The operator is made aware of the ambiguity by the flashing of an indicator where the digit is to be displayed.

2 Claims, 1 Drawing Sheet

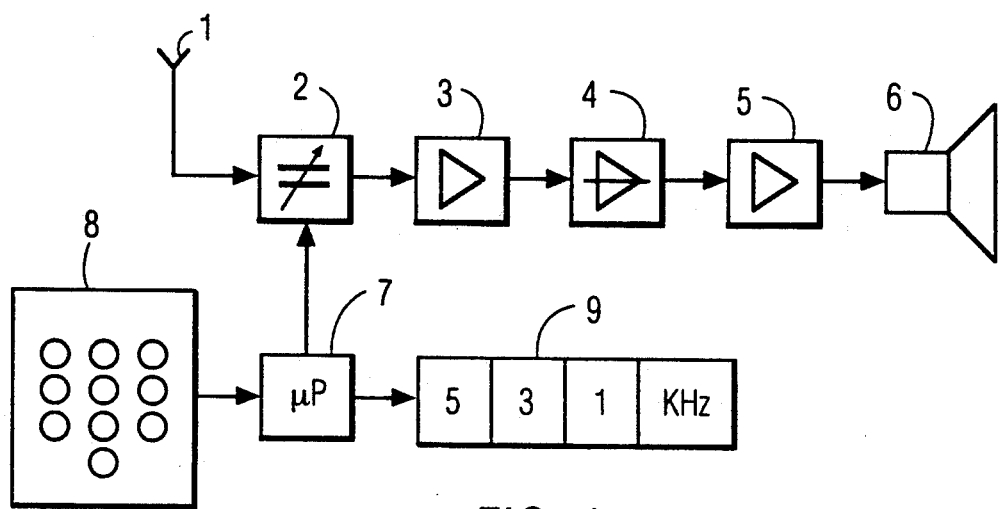
FIG. 1
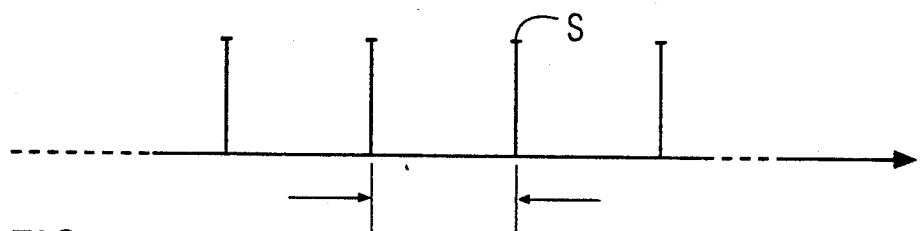
FIG. 2
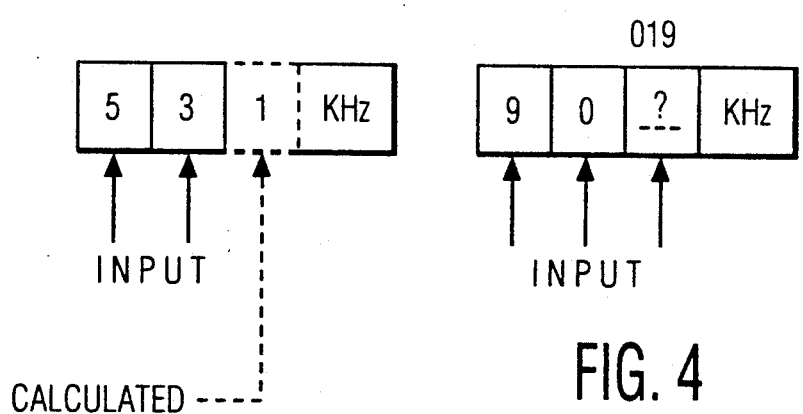
FIG. 3
FIG. 4

METHOD OF AUTOMATICALLY TUNING A RADIO

This is a continuation of PCT application PCT/EP 90/00590 filed Apr. 14, 1990 by Friedrich Fuldner and titled "Radio Receiver with Digital Frequency Selection".

Typically, the the-digit frequency for a particular transmitter station is selected using a keyboard with keys numbered 1 through 0. Accordingly, in the prior art, three keys must be depressed and, it therefore is easy to insert an incorrect digit. When an erroneous frequency is input of the receiver, the user is informed through a display and a new input must be made. The invention simplifies the manual selection of the frequency for the desired station and also minimizes the number of incorrect inputs for a radio receiver.

The invention is based on the face that in the medium frequency range (e.g. 100's of kHz) all the transmitter frequencies are whole number multiples of 9 kHz. Accordingly, all the transmitter frequencies are spaced by equal frquency separations of 9 kHz, and the total of the digits for most frequencies equals either nine or eighteen. Accordingly, when the first two digits of a three-digit frequency are input, in most instances the third and final digit can be automatically calculated by a microprocessor. The manual input of the final digit therefore is not required of the majority of frequencies. Rather, the final digit is automatically determined by the processor and used to tune to the desired station and to display the station frequency, and the possibility of an incorrect input of the third and final digit is avoided. Preferably, in instances in which the final digit is ambiguous, because the first two digits, total either none or eighteen, as explained hereinafter, the display location for the final digit is made to blink as an indication to the operator that the final digit must be provided manually. However, manual input is necessary for only about 20% of al three-digit frequencies. For about 80% of all three-digit frequencies the final digit is unambiguous when the penultimate digit is input. The operation also is simplified in that in most cases the operator need not known what the final digit is. In the FIGURES:

FIG. 1 is a block diagram of a preferred embodiment of a radio receiver constructed according to the invention.

FIG. 2 shows the frequency separation of the transmitter frequencies.

FIGS. 3 and 4, respectively, show the frequency display for an unambiguous and an ambiguous frequency in the medium frequency range.

In FIG. 1 a medium range radio receiver includes an antenna 1, a tunable high frequency section 2, an I.F. amplifier 3, a demodulator 4, a low frequency amplifier 5 and a loudspeaker 6. The tunable high frequency section 2 is controlled by a microprocessor 7, which is connected to a keyboard 8 and a display 9. The frequency of the desired radio station is input manually using a ten-key keyboard 8 and is fed to the microprocessor 7, which thereupon initiates the tuning of the high frequency section 2 to the desired frequency and also displays the selected frequency on the display 9.

FIG. 2 shows the the transmitter stations S in the medium wave range have an equal frequency separation of 9 kHz. The total of the three digits of ma y frequencies is equal to either nine or eighteen and every frequency is an integer multiple of 9 kHz.

In FIG. 3 it is assumed that the frequency of the desired radio station is 531 kHz. Initially when tuning to this station the first two digits "5" and "3" are manually input using the keyboard 8. The microprocessor 7 then calculates the final digit, which i unambiguous because the first two digits total eight and the third digit therefore must be "1". The two adjacent stations on each side of the selected station have the frequencies 522 and 540 kHz, which are unambiguous and ambiguous, respectively. The display of all three digits of the frequency 531 kHz is presented on the display 9 in a scarcely-perceptible instant of time following the input of the digit "3" although the final digit "1" was not input manually. Simultaneously, the receiver is tuned to the 531 kHz frequency.

FIG. 4 shows an example in which the third digit is ambiguous because the first tow digits total 9. After the first two digits "9" and "0" are input, two frequencies 900 kHz and 909 kHz are possible. Accordingly, the processor 7 causes the portion of the display 9 where the final digit is displayed to blink as an indication to the operator that the final digit must be provided manually. The frequency 540 kHz is ambiguous because the first two digits total nine. The third digit can e either zero or nine because the 540 kHz and 549 kHz frequencies meet the even multiple of nine criteria. In all instances when the first two digits total nine the third digit is ambiguous and must be manually input.

Other ambiguous situations also exist, for example three digit frequencies in which the sum of the first two digits totals more than nine also exist in the medium frequency range. A frequency of 468 kHz is an example. The total of the first two digits is ten, which exceeds nine. However, 468 is a whole number multiple of nine and thus, is a valid frequency. Accordingly, in order to automatically input the third digit the microprocessor subtracts the sum of the first two digits from eighteen and provides the remainder as the third digit. When the first two digits total eighteen the third digit is ambiguous and must be provided manually. Accordingly, when the first two digits total less than nine the third digit is the difference between nine and the total of the two. When the first two digits total more than nine, and less than eighteen, the total of the first two is subtracted form eighteen and the remainder is automatically input as the third digit. When the total of the first two digits is equal to either nine or eighteen the third digit is ambiguous and must be manually input. Accordingly, a very high percentage of the total frequencies available are automatically input and tuned to the desired station. A microprocessor of the type m (micro) PD75308 from the firm NEC can be used for the microprocessor 7.

I claim:

1. A method of determining the frequency of tuning of a radio receiver to any one of a plurality of radio transmitters operating in a band of three digit frequencies separated by 9 KHz intervals comprising the steps of:

sequentially providing the first two digits of one of said three digit frequencies to a processor through a keyboard;

using said processor to determined and automatically input the third digit based upon the values of the first two digits; and causing a display to indicate when the determination of the third digit is ambiguous in order to indicate that the third digit should be manually inputted.

2. The method of claim 1 further including the step of displaying said one of said three digit frequencies on a display device.

* * * * *